United States Patent [19]
Bartholomew et al.

[11] Patent Number: 5,696,785
[45] Date of Patent: Dec. 9, 1997

[54] IMPURITY GETTERS IN LASER ENCLOSURES

[75] Inventors: Roger F. Bartholomew, Painted Post; Margaret K. Faber, Corning; Julia A. Sharps, Corning; Kenneth E. Zaun, Corning, all of N.Y.

[73] Assignee: Corning Incorporated, Corning, N.Y.

[21] Appl. No.: 320,549

[22] Filed: Oct. 11, 1994

[51] Int. Cl.$^6$ ............................... H01S 3/22; H01S 3/223
[52] U.S. Cl. ............................................................. 372/59
[58] Field of Search ...................... 372/43, 59; 257/682; 250/370.15

[56] References Cited

U.S. PATENT DOCUMENTS

| | | | |
|---|---|---|---|
| 3,576,474 | 4/1971 | Huber et al. | 257/682 |
| 4,553,020 | 11/1985 | Val | 219/209 |
| 4,631,267 | 12/1986 | Lachman et al. | 502/439 |
| 4,637,995 | 1/1987 | DeAngelis et al. | 503/439 |
| 4,656,638 | 4/1987 | Tihanyi et al. | 372/49 |
| 4,722,090 | 1/1988 | Haruta et al. | 372/57 |
| 4,740,982 | 4/1988 | Hakuta et al. | 372/59 |
| 4,769,345 | 9/1988 | Butt et al. | 437/217 |
| 5,392,305 | 2/1995 | Jakobson | 372/43 |
| 5,513,198 | 4/1996 | Jakobson | 372/43 |

OTHER PUBLICATIONS

Sharps et al, "Effects of Packaging Atmosphere and Organic Contamination on 980 nm Laser Diode Reliability", from OAC presentation, Aug., 1994.
Patent Abstracts of Japan, vol. 018 No. 174 (E-1530), Mar. 24, 1994, JP-A-5343812 (Kubota Corp.) Dec. 24, 1993.
Patent Abstracts of Japan, vol. 009 No. 075 (E-306), Apr. 4, 1985, JP-A-59208860 (Hitachi Maikuro Computer Engineering KK; others: 01) Nov. 27, 1984.
Patent Abstracts of Japan, vol. 012 No. 191 (C-501), Jun. 3, 1988, JP-A-62297211 (Kanebo Ltd.) Dec. 24, 1987.
Guch et al, "Beyond Perfection: The Need for Understanding Contamination Effects on Real-World Optics", preprint from Oct. 27, 1993 Boulder Conference on Laser Packaging (Laser Systems Division of Litton Systems, Inc.).
"The Handbook for Molecular Sieves", R. Szostak, Van Nostrand Reinhold, New York 1992 (no month available).
"A New Family of Mesoporous Molecular Sieves Prepared with Liquid Crystal Templates" Journal of American Chemical Society, 1992, 114, pp. 10,834–10,843. (no month).
U.S. Patent Application Ser. No. 08/091,657—Paul Jakobson, filed Jul. 14, 1993 entitled "Packaging of High Power Semiconductor Lasers".
"MCM-22: A Molecular Sieve with Two Independent Multidimensional Channel Systems" Science, vol. 264, Jun. 24, 1994, written by Michael Leonowicz, Jeffrey Lawton, Stephen Lawton and Mae Rubin.
Continuation-in-Part Application S.N. 08/168,125, filed Dec. 17, 1993, Hall et al., being a C-I-P of S.N. 08/091,657, entitled "Packaging of High Power Semiconductor Lasers".

*Primary Examiner*—Rodney B. Bovernick
*Assistant Examiner*—Robert E. Wise
*Attorney, Agent, or Firm*—Edward F. Murphy

[57] ABSTRACT

A getter for immobilizing water and organic molecules which may be present as impurities in an enclosure for a high power laser. The getter is formulated from selected zeolite compositions having a pore or channel size suitable for immobilizing water and a size range of organic molecules up to about 40 microns. A binder is used to provide a getter having sufficient strength to allow use of the getter in a laser enclosure in a telecommunications application. The binder also provides a substantially dust free getter body to maintain the cleanliness of the interior of the laser enclosure. Getters which immobilize only organics or only water are contemplated.

22 Claims, 1 Drawing Sheet

IMPURITY GETTERS IN LASER ENCLOSURES

BACKGROUND

The invention is directed to a getter material for use in a sealed enclosure containing electronic circuitry and at least one high power laser. As used herein, high power refers to light intensity per unit area, i.e., photon flux per unit area. A high power laser is one having a photon flux density of about 0.1 Megawatts/$cm^2$ or more.

The introduction of optical amplifiers into telecommunications systems has led to the use of high power pump lasers. Furthermore the demand for high data rate systems with long repeater spacing has resulted in the use of high power signal lasers. It has been discovered that the packaging of such high power lasers must be modified from standard industry practice to insure acceptable laser life.

A possible mechanism for shortened laser life in the standard package is accumulation of solid or liquid material on intensely illuminated surfaces, such as the laser front facet, lenses in the laser beam or the fiber lenses and windows. The surface accumulation may occur as follows. Mobile hydrocarbons from solder flux residue, cleaning solvents, contaminants in the assembly environment, or the like are present in the hermetically sealed laser container. A photo-reaction may occur when a hydrocarbon encounters the laser photon flux. The products of the photo-reaction may form a deposit on the intensely illuminated surfaces. Laser performance will be degraded by these deposits reflecting or absorbing the laser light. If the deposits absorb photons, heat build up can occur, causing melting of an active or passive surface. For the laser diode, the heat build up may cause accelerated diffusion of dopants at or near the junction thereby destroying the junction or reducing the junction efficiency.

It has further been found that introducing a selected amount of oxygen into the sealed atmosphere of the package acts to lengthen laser life. The action of the oxygen may be to combine with a hydrocarbon contaminant or the products of a photo-reacted hydrocarbon to prevent or remove accumulations on passive or active components in the laser enclosure.

However, oxygen in the enclosure can form water when combined with hydrogen present in the enclosure atmosphere. The hydrogen may be present as a contaminant in the gas filling the enclosure or may outgas from the metal walls of the enclosure as temperature of the enclosure increases. It is well known that water causes electrical shorts, corrosion or electro-migration in the electrical circuits present in the enclosure.

Thus there is a need for a getter material which will serve to bind with or adsorb, and thus immobilize, impurity hydrocarbons and water which may be present in the laser enclosure atmosphere.

Such a getter should:

be able to immobilize a wide range of hydrocarbons because the type of hydrocarbon impurity is in general unknown;

be able to immobilize molecules having a wide size range because a water molecule has a largest dimension of about 3 angstroms and organics present in the enclosure may have a largest dimension of about 40 angstroms;

be inert over the operating temperature range of the laser enclosure;

be inert when irradiated with light from the laser;

be small in size because the enclosure volume is small, typically about 1 to 10 $cm^3$;

because of its small size, be very efficient in absorbing organic and water molecules; and, be free of organic material or contain only organic material which cannot leave the getter under the conditions found within the laser enclosure.

An effective getter for a laser enclosure should typically immobilize molecules in a size range from about 2.5 angstroms to about 40 angstroms and be capable of immobilizing a mass of water and organics at least equal to about 1% of the getter mass.

SUMMARY OF THE INVENTION

The present invention meets the need for a small, efficient getter capable of immobilizing water and a plurality of organics which vary in molecular size.

A first aspect of the invention is a consolidated porous body, herein called a getter, for immobilizing water and organic molecules in an enclosure for a high power laser. The getter includes an inorganic binder and compounds chosen from a group labelled W and a group labelled O.

In general, the W group is comprised of material which has a pore or channel size suitable for immobilizing water. The O group has a pore or channel size suitable for immobilizing the larger organic molecules.

The W group consists of zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds.

The O group consists of porous silica, porous Vycor™, activated carbon, porous carbon, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, IB, and IIB, and combinations of these compounds. MCM-22 and MCM-41 are compound names of the Mobil Research and Development Corporation. MCM-41 is a silicate/aluminosilicate molecular sieve having a hexagonal arrangement of mesopores. MCM-41 is discussed in detail in J. Am. Chem. Soc. 1992, 114, 10834–10843. MCM-22 is the working name for a newly discovered molecular sieve having the formula $H_{0.033}Na_{0.043}(Al_{0.005}B_{0.071}Si_{0.924})O_2$. MCM-22 is discussed in Science, 264, 1910, 1994 and is mentioned in C&EN, 4 Jul. 1994.

The binder may be one or more clay compositions such as members of the kaolinite group or montmorillonite group minerals. The invention contemplates other similar clays known to those skilled in the art.

The binder may also include one or more of the group silica from a silicone resin precursor, fused silica, alumina, cordierite, mullite, and glass frit having a melting point below about 600° C. The particle size of the inorganic binder in the getter, except for one derived from a precursor, is in the range of about 1 to 75 microns, with a preferred size range of about 20 to 50 microns. The preferred inorganic binder is silica from a silicone resin precursor which is used in essentially every getter.

A getter contains compounds from the W group and compounds from the O group, wherein the total weight percent of each group is in the range 10% to 80%. Unless stated otherwise, weight percent is based upon the combined weight of the W compounds, the O compounds and the inorganic binder compounds comprising the getter.

An embodiment of the inventive getter includes about 25% to 45% by weight of zeolite type 4A, from the W group, and about 25% to 45% by weight of ZMS-5 and about 15% to 25% by weight of porous silica, both from the O group. The inorganic binder is silica from a silicone resin precursor, wherein enough silicone resin is added to yield about 5% to 15% by weight of silica in the getter.

Another embodiment of the inventive getter includes zeolite type 4A and zeolite type ZMS-5 each in an amount in the range of about 20 to 40 weight percent. The first inorganic binder is about 5 to 15 weight percent silica, from a silicone resin precursor. The second inorganic binder is a glass frit having a weight percent in the range of about 20 to 40 and a melting point no greater than about 600° C.

A preferred embodiment includes about 25 to 45 weight percent of zeolite type 4A, about 25 to 45 weight percent ZMS-5, and about 10 to 30 weight percent Vycor™. The binder is about 5 to 15 weight percent silica from a silicone resin precursor.

The binder compounds serve to make the getter sufficiently strong and abrasion resistant to prevent breakage or dusting of the getter during handling of the getter or installation and use of the hermetically sealed laser enclosure containing the getter.

Another aspect of the invention is a getter for organic molecules in a high power laser enclosure comprising an inorganic binder and a component O. The binder may be one or more clay compositions such as a member of the kaolinite group or montmorillonite group minerals. The invention contemplates other similar clays known to those skilled in the art.

The binder may also include one or more of the group silica from a silicone resin precursor, fused silica, alumina, cordierite, mullite, and glass frit having a melting point below about 600° C. The particle size of the inorganic binder in the getter, except for one derived from a precursor, is in the range of about 1 to 75 microns, with a preferred size range of about 20 to 50 microns.

The O group consists of porous silica, porous Vycor™, activated carbon, porous carbon, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, IB, and IIB, and combinations of these compounds.

A further aspect of the invention is a packaged high power laser including a getter, as defined above, for inorganic molecules. A hermetically sealed enclosure contains the getter and the high power laser.

Yet another aspect of the invention is a packaged high power laser including a getter, as defined above, for water and inorganic molecules. A hermetically sealed enclosure contains the getter and the high power laser. The atmosphere within the enclosure contains a gaseous medium which includes at least 100 ppm oxygen.

Yet a further aspect of the invention is a device for pumping an optical waveguide amplifier fiber including a high power laser, a getter for immobilizing organic impurities and means for coupling the laser to the amplifier waveguide fiber. The laser and getter are contained in a hermetically sealed enclosure. The coupling means may be wholly or partially contained within the enclosure as explained below.

Another aspect of the invention is a device for pumping an optical waveguide amplifier fiber including a high power laser, a getter for immobilizing water and organic molecules and means for coupling the laser to the waveguide fiber amplifier. The atmosphere within the enclosure contains a gaseous medium which includes at least 100 ppm oxygen.

The invention is also a method of making a getter for use in a sealed enclosure for a high power laser comprising the steps:

mixing the components W, O, an inorganic binder and an organic binder;

adding and mixing an organic solvent and water to plasticize the mixture;

forming the plasticized mixture into a green body;

stiffening the green body using drying means including drying in air at about 95° C. for one to five days or by drying for a few minutes in a dielectric dryer; and, calcining the green body in a furnace at a temperature in a range of about 500° to 700° C. for a time in the range of about 4 to 12 hours. It is well known to those skilled in the art that the hydrothermal stability of various zeolites is dependent on the calcination conditions which are used, including the calcination temperature and relative humity. Therefore, the choices of the particular components (from groups W and O) which are used in the getter, dictate the hydrothermal conditions during the calcination process. If only carbon is used in the getter the appropriate temperature range is from about 900° C. to 1100° C. for a time in the range of about 4 to 12 hours. Except in cases wherein carbon is included in the getter, the furnace has an atmosphere containing oxygen. It is known to those of ordinary skill in the art that the structural stability of a zeolite, which affects the zeolite gettering properties, is influenced by calcining temperature and furnace atmosphere, particularly the water content of the furnace atmosphere. As an example, an electric furnace operated in an essentially uncontrolled factory environment is suitable for the temperature range stated above.

The binder and component W are as defined hereinabove. The component O is defined as hereinabove except that the carbon containing group members are excluded.

The inorganic binder is chosen from the group, silica from a silicone resin precursor, fused silica, alumina, cordierite, mullite, and glass frit having a melting point below 600° C. The inorganic binders, except those derived from a precursor, have a particle size in the range of about 1 to 75 microns.

The forming step of the method includes extruding, pressing and pelletizing.

The organic binder is chosen from the group methylcellulose, ethylcellulose, hydroxybutylcellulose, hydroxybutymethylcellulose, hydroxyethylcellulose, hydroxymethylcellulose, hydroxypropylcellulose, hydroxypropylmethylcellulose, hydroxyethylmethylcellulose, sodium carboxymethylcellulose, and combinations of these compounds.

When carbon containing compounds are included in the getter, the calcining step in the method is done in a furnace having an inert atmosphere which does not react with the green body or the calcined body. The furnace may be evacuated or filled with an inert gas.

When a clay, such as those from the kaolinite or montmorillonite groups, is used as a binder it may be included in one of two ways. The clay binder may be mixed with the batch and dispersed throughout the getter body. As an alternative, the getter body after the calcining step may be immersed in a solution or suspension of the clay or otherwise coated with the clay. The clay coated getter body is then calcined again using a furnace having a temperature of about 500° C. to about 700° C. for a time in the range of about 4 to 12 hours.

DETAILED DESCRIPTION OF THE INVENTION

Figure 1:
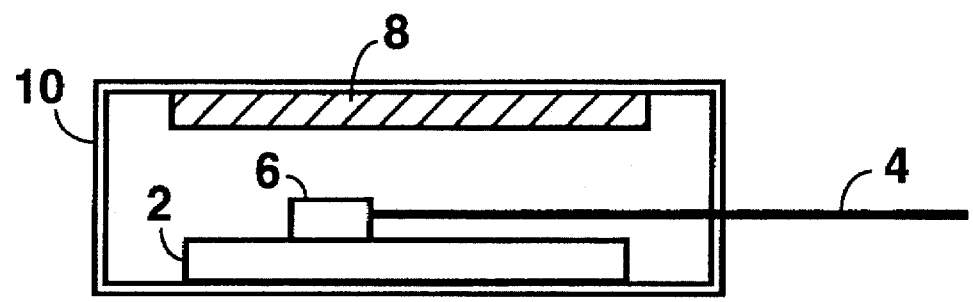
FIG. 1 is a cut away side view of a laser enclosure incorporating a getter.

The ability of certain compounds to immobilize organic and inorganic molecules is well known. For information relating to the zeolite category of such immobilizing compounds see, "The Handbook of Molecular Sieves", Rosemarie Szostak, Van Nostrand Reinhold, New York, 1992.

The present invention is directed to the formulation and manufacture of a molecular trap or getter suitable for use in a hermetically sealed enclosure for a high powered laser. The getter acts to immobilize a pre-selected type and size molecule. The getter addresses a problem discovered in the packaging of high powered lasers. The package generally accepted in the industry is one including an inert gas in the laser enclosure. Life of high power lasers was found to be dramatically shortened when the standard industry package was used. The solution to the laser life problem, as discussed in patent application Ser. No. 08/091,657, filed 14 Jul. 93, related to adding oxygen to the gaseous medium in the enclosure to prevent photo-reaction of organic impurities in the enclosure with the laser photon flux. It was recognized that the presence of oxygen in the laser enclosure could lead to the formation of water within the enclosure, thereby causing degradation of the circuitry associated with the laser device. This problem was addressed in a C-I-P, Ser. No. 08/168,125, filed 17 Dec. 93, of patent application Ser. No. 08/091/657 now U.S. Pat. No. 5,392,305. In the C-I-P, a getter was introduced into the enclosure to absorb water.

Further work on getter formulations has been done and novel getters for use in high power laser enclosures are proposed here.

The W group compounds, which may be used as a component of the getter, have a pore or channel size suitable for immobilizing molecules having a dimension of about 2.6 angstroms, the dimension of water. The O group has a pore or channel size for immobilizing the larger organic molecules, such as those from solder flux or epoxy, which have dimensions of tens of angstroms. Thus a formulation including compounds from both the W and O group provides a getter for molecules ranging in size from about 2.5 angstroms to about 40 angstroms. This range covers substantially all the molecules which may occur as impurities in a laser enclosure resulting from the construction of an operational laser. This size range could be widened to accommodate impurities of larger or smaller size should the need arise.

The function of the inorganic binder in the consolidated porous getter is to prevent crumbling or fracture of the getter during assembly of the laser enclosure and during installation and operation of the laser. In addition, the binder provides a getter which is not a source of dust particles which could interfere with the proper performance of the laser and the associated lenses and mirrors.

The reliability requirements of the telecommunication industry are stringent. Telecommunication equipment is specified to function for extended time periods in environments characterized by wide temperature and humidity ranges and by vibration and impact. The inorganic binder in the inventive getter is chosen to meet the exacting industry standards.

Inorganic binders which are dispersed throughout the getter volume and binders which are applied only to the getter surface are contemplated. A preferred dispersed binder is silica from a silicone resin precursor, as discussed in the examples below. An effective surface binder may be a clay layer grown on the getter surface before or after the firing or calcining step. However, a clay may also be used as a binder dispersed throughout the getter body.

A clay mineral such as a montmorillonite or kaolinite group mineral, or combinations thereof, may be added to the getter batch as a binder. When the getter is calcined, this clay material will impart strength to the getter and will improve cohesion of the getter particles thereby reducing dusting. As an alternative, the getter may be formed and calcined without a clay binder. After calcining, a clay mineral or combination of minerals can be grown, for example, from a solution of the clay mineral(s), in the inter-granular pore space of the getter. After such a growing step, the getter must be dried and calcined to remove excess water. A getter so treated would be strong and essentially dust free.

The steps discussed above for a clay mineral also apply to a group of selected zeolites which may be used in place of clay to provide a strong, cohesive, essentially dust free getter.

The organic binders and the organic solvents and water are added to the mixture of materials which make up the getter batch to provide a plastic consistency of the batch to facilitate forming by extrusion, pelletizing or pressing. The shape and size of the laser enclosure is typically such that the preferred getter form is a flat sheet about 1 mm in thickness. Extrusion is a preferred forming method because this process is cost effective in making large amounts of getter green body material having uniform dimensions and density.

However, alternative forming methods are contemplated including depositing, i.e., slip casting or wash coating, the getter from, for example, a suspension onto a porous ceramic substrate such as silica, or an aluminosilicate, followed by calcining at a temperature in the range of about 500° to 700° C. for about 4 to 12 hours. The calcining temperature is chosen to be sufficiently high to consolidate the green body and drive off volatiles. However, the temperature must not be so high as to lessen the zeolite immobilizing ability. For each getter formulation, a few calcining trials may be required to establish the optimum calcining temperature in the range stated above.

This forming method can yield a sufficiently strong and dust free getter for use in a laser enclosure.

FIG. 1 is a side cut away illustration of a getter positioned within a high power laser enclosure 10. The high power laser 6 is fixed to substrate 2. The electronic devices and circuitry which are associated with the laser and typically contained in the enclosure are not shown. The means for coupling the laser light to a receiving device or to a waveguide fiber is shown as waveguide fiber 4. Other coupling means such as lenses or integrated waveguide devices may be employed as couplers. The laser light may be coupled to a receiving device or a waveguide located within the enclosure. As an alternative, the coupling means may allow the laser light to pass out of the enclosure through a sealed aperture. The inventive getter 8 is shown as a thin slab attached to the top inside surface of the hermetically sealed enclosure. Getter 8 may be adhesively attached, or metallized and soldered, or held in a permeable container. Also getter bodies may be fixedly attached to any or all of the inside surfaces of the enclosure. Because of the typically small inside volume of the enclosure, a single getter body attached to an inside surface should be effective to immobilize the water and organic impurities which may be present.

The device illustrated in FIG. 1 may be a high power signal laser or a high power pump laser for an amplifier fiber. Typical practice in the case of a pump laser is to couple the laser to a waveguide amplifier fiber by coupling means which conduct light through a sealed aperture in the enclosure wall. A waveguide fiber is a typical coupling means.

Figure 2:
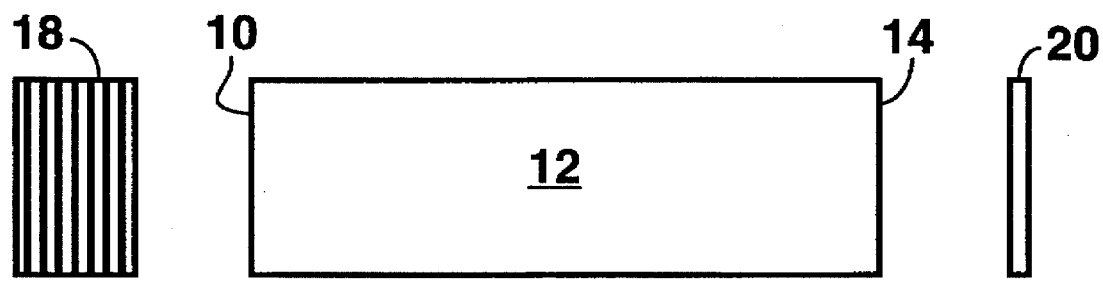
FIG. 2 is an exploded side view showing typical components of a high power laser.

FIG. 2 is an illustration of the parts of a high powered laser. The lasing body 12 is shown as having a front facet 14. The front and back facet partially reflective mirrors 20 and 18, respectively support the lasing action. The photon flux through the front mirror 20 is, in general about a factor of ten higher than the flux through the rear facet. Photo-reactions, which may cause deposits on mirror 20 or other optical components within the enclosure, take place in the flux path beginning at mirror 20. It is these photo-reactions which the getter eliminates or limits to amounts which do not effect laser performance.

EXAMPLE 1

A batch of 35 weight percent zeolite ZSM-5, 35 weight percent zeolite 4A, and 20 weight percent powdered fused silica was dry mixed. Nineteen weight percent of Dow Corning silicone resin Q6-2230 was added and dry mixed into the batch. This amount was sufficient to yield about 10 weight percent silica in the finished getter. Dow Corning methyl cellulose at about 6 weight percent super-addition was also dry mixed into the batch. The base weight percent is taken as the combined weight of the components W, O, and the inorganic binder. A super-addition weight percent is calculated on the base weight but is not included in the base weight for weight percent calculations. An organic solvent, either isopropyl alcohol or Dupont dibasic ester, and water was added to the dry mixture to produce an extrudable batch consistency. The plasticized batch was extruded into flat sheets, having a thickness no greater than about 1 mm. The green body sheets were dried in air at about 95° C. for 1–5 days. An alternative drying method is the use of a dielectric dryer which can reduce drying time to a few minutes. The dried sheets were calcined in air at about 600° C. for about 10 hours. The resulting getter sheets were found to be strong and substantially dust free.

EXAMPLE 2

Using the same mixing, plasticizing, and extrusion procedure of example 1, a getter was made having a composition of 30 weight percent zeolite 4A, 30 weight percent zeolite ZSM-5, 10 weight percent silica from silicone resin, and 30 weight percent of a glass frit having a melting temperature less than 500° C. The getter green body was calcined as in example 1. A strong, substantially dust free, getter was obtained.

EXAMPLE 3

A most preferred embodiment of the invention is the formulation, using essentially the same procedure as in example 1, about 35 weight percent zeolite 4A, about 35 weight percent zeolite ZMS-5, about 20 weight percent porous Vycor™ and about 10 weight percent silica from a silicone resin precursor. The batch was plasticized, extruded and calcined as in example 1. The resulting getter had exceptional strength properties and was essentially dust free.

A getter was cut from the sheet and inserted into a high power laser enclosure which was then filled with a gaseous medium containing about 20 percent oxygen and hermetically sealed. In addition, a hermetically sealed container was prepared as above with no oxygen in the gaseous medium. Back facet power, a sensitive indicator of deposits on the critical laser surfaces, was monitored continuously. No indication of failure has been observed after more than 1000 hours of laser operation.

It will be noted that certain embodiments of the getter are designed to immobilize water as well as organics. However, embodiments of the getter are contemplated wherein organic molecules are the primary target of the getter. These latter embodiments are applicable in those situations where water is controlled in the construction of the enclosure and oxygen is not required because of the efficiency of the getter. It is apparent that getters designed to immobilize only water are within the scope of the invention.

Although specific embodiments of our invention have hereinbefore been disclosed and described, it will be understood that the scope of our invention is nevertheless to be defined by the following claims.

What is claimed is:

1. A getter for water and organic molecules in a high power laser enclosure comprising:
   a consolidated porous body comprising,
   an inorganic binder and components W and O,
   wherein W is chosen from the group, zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds, and
   wherein O is chosen from the group, porous silica, porous Vycor™, activated carbon, porous carbon, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, IB, and IIB, and combinations of these compounds.

2. The getter of claim 1 wherein said inorganic binder is chosen from the group, kaolinite and montmorillonite group minerals, silica from a silicone resin precursor, fused silica, alumina, cordierite, mullite, and glass frit having a melting point below 600° C., wherein said inorganic binder, except one derived from a precursor, has a particle size in the range of about 1 micron to 75 microns.

3. The getter of claim 2 wherein said inorganic binder has a particle size in the range of about 20 microns to 50 microns.

4. The getter of claim 1 wherein the weight % of each of said components W and O is at least 10% and no greater than 80%.

5. The getter of claim 1 wherein said component W is zeolite type 4A having a weight % in the range of about 25 to 45, and said component O is ZMS-5 having a weight % in the range of about 25 to 45, and porous silica having a weight % in the range of about 15 to 25, and said inorganic binder is silica, from a silicone resin precursor, having a weight % in the range of about 5% to 15%.

6. The getter of claim 1 wherein said component W is zeolite type 4A having a weight % in the range of about 20% to 40%, and said component O is ZMS-5 having a weight % in the range of about 20% to 40%, and said inorganic binder is silica, from a silicone resin precursor, having a weight % in the range of about 5% to 15%, and a glass frit having a weight % in the range of about 20% to 40% and a melting point below 600° C.

7. The getter of claim 1 wherein said component W is zeolite type 4A having a weight % in the range of about 25% to 45%, said component O is a combination of zeolite type ZSM-5, having a weight % in the range of about 25% to 45%, and porous Vycor™, having a weight % in the range of about 10% to 30%, and said inorganic binder is silica, from a silicone resin precursor, having a weight % in the range of about 5% to 15%.

8. The getter of claim 1 wherein said getter has a strength and an abrasion resistance such that essentially no dust particles are dislodged from said getter during the construction, installation and operation of said laser enclosure.

9. A packaged high power laser comprising:
   a high power laser;
   a getter for immobilizing organic impurities and water, said getter having a consolidated porous body comprised of an inorganic binder and components W and O,
   wherein W is chosen from the group, zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds, and
   wherein O is chosen from the group, porous silica, porous Vycor™, activated carbon, porous carbon, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, 1B, and IIB, and combinations of these compounds; and
   a hermetically sealed container enclosing said laser and said getter.

10. The packaged high power laser of claim 9, wherein said inorganic binder comprises silica, said component W comprises zeolite type 4A, and said component O comprises zeolite type ZSM-5 and porous Vycor™.

11. The packaged high power laser of claim 9 wherein said getter comprises a flat sheet.

12. A device for pumping an optical waveguide amplifier fiber comprising: a high power laser;
   an optical waveguide fiber optically coupled to said high power laser;
   a getter for immobilizing organic impurities and water, said getter having a consolidated porous body comprised of an inorganic binder and components W and O,
   wherein W is chosen from the group, zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds, and
   wherein O is chosen from the group, porous silica, porous Vycor™, activated carbon, porous carbon, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, 1B, and IIB, and combinations of these compounds.

13. The device for pumping an optical waveguide amplifier of claim 12 wherein said component W is zeolite type 4A having a weight % in the range of about 25% to 45%, said component O is zeolite type ZSM-5, having a weight % in the range of about 25% to 45%, and porous Vycor™, having a weight % in the range of about 10% to 30%, and said inorganic binder is silica, having a weight % in the range of about 5% to 15%.

14. The device for pumping an optical waveguide amplifier fiber of claim 12 wherein said getter inhibits failure of said high power laser for at least a thousand hours of high power laser operation.

15. A method of making a getter for use in a sealed high power laser enclosure comprising the steps:
   mixing the ingredients W, O, an inorganic binder and an organic binder,
   wherein W and O respectively have a weight % in the range of about 10% to 80%, and,
   wherein W is chosen from the group, zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds, and
   wherein O is chosen from the group, porous silica, porous Vycor™, activated alumina, porous alumina, mordenite, cloverite, MCM-22, MCM-41, zeolite type ZSM- 5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, IB, and IIB, and combinations of these compounds, and
   wherein said inorganic binder has a weight % in the range of about 5% to 40% and said organic binder is a super addition having a weight % in the range of about 3% to 10%;
   adding an organic solvent and water wherein said organic solvent is a super addition in the weight % range of about 10% to 20% and said water is a super addition in the weight % range of 20% to 45% to form a plasticized mixture;
   forming said plasticized mixture into a green body;
   stiffening said green body using drying means, and,
   calcining said green body at a temperature in the range of about 500° C. to 700° C. in a furnace having an atmosphere containing oxygen, for a time in the range of about 4 to 12 hours to form a getter.

16. The method of claim 15 wherein said inorganic binder is chosen from the group, kaolinite group minerals, montmorillonite group minerals, silica from a silicone resin precursor, fused silica, alumina, cordierite, mullite, and glass frit having a melting point below 600° C., wherein said inorganic binder, except for one derived from a precursor, has a particle size in the range of about 1 to 75 microns.

17. The method of claim 15 wherein said forming step is selected from the group, extruding, pressing and pelletizing.

18. The method of claim 15 wherein said organic binder is chosen from the group methylcellulose, ethylcellulose, hydroxybutylcellulose, hydroxybutymethylcellulose, hydroxyethylcellulose, hydroxymethylcellulose, hydroxypropylcellulose, hydroxypropylmethylcellulose, hydroxyethylmethylcellulose, sodium carboxymethylcellulose, and combinations of these compounds.

19. The method of claim 15 further including the steps:

immersing said getter in a solution or suspension of kaolinite or montmorillonite group minerals; and recalcining said getter as defined in said calcining step.

20. The method of claim 15 further comprising the steps of:

inserting said formed getter into a high power laser enclosure; and hermetically sealing said high power laser enclosure.

21. A method of making a getter for use in a sealed high power laser enclosure comprising the steps:

mixing the ingredients W, O, an inorganic binder and an organic binder, wherein W and O respectively have a weight % in the range of about 10% to 80%, and, wherein W is chosen from the group, zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds, and wherein O is chosen from the group, porous silica, porous Vycor™, activated carbon, porous carbon, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, IB, and IIB, and combinations of these compounds, and wherein said inorganic binder has a weight % in the range of about 5% to 40% and said organic binder is a super addition having a weight % in the range of about 3% to 10%;

adding an organic solvent and water wherein said organic solvent is a super addition in the weight % range of about 10% to 20% and said water is a super addition in the weight % range of 20% to 45% to form a plasticized mixture;

forming said plasticized mixture into a green body;

stiffening said green body using drying means; and, calcining said green body at a temperature in the range of about 500° C. to 700° C. for a time of about 6 to 10 hours, said calcining step carried out in a furnace having an inert atmosphere which does not react with said green body or a calcined body.

22. A method of making a getter for use in a sealed high power laser enclosure comprising the steps:

mixing the ingredients W, O, and an organic binder, wherein W and O respectively have a weight % in the range of about 10% to 80%, and, wherein W is chosen from the group, zeolite type 3A, 4A, 5A, Linde type M zeolite, analcime, chabazite, erionite, offretite, phillipsite, ferrierite, any of the immediately preceding zeolite types which are ion exchanged with at least one element from the group of alkali metals, alkaline earths, transition metals from periodic table groups VA, VIA, VIIA, VIIIA, IB, and IIB, and combinations of these compounds, and wherein O is chosen from the group, porous silica, porous Vycor™, activated alumina, porous alumina, mordenite, cloverite, MCM-22, MCM-41, zeolite type ZSM-5, X, Y, 10A, and beta zeolite, any of the immediately preceding zeolite types which are ion exchanged with at least one metal from the group of alkali metals, alkaline earths, transition metals from periodic table groups VA, VIA, VIIA, VIIIA, IB, and IIB, and combinations of these compounds, and wherein said organic binder is a super addition having a weight % in the range of about 3% to 10%;

adding an organic solvent and water wherein said organic solvent is a super addition in the weight % range of about 10% to 20% and said water is a super addition in the weight % range of 20% to 45% to form a plasticized mixture;

forming said plasticized mixture into a green body;

stiffening said green body using drying means;

depositing an inorganic binder over the surface of said green body; and, calcining said green body at a temperature in the range of about 500° C. to 700° C. in a furnace having an atmosphere containing oxygen, for a time in the range of about 4 to 12 hours.

* * * * *